United States Patent
Sato et al.

(10) Patent No.: US 10,090,028 B2
(45) Date of Patent: *Oct. 2, 2018

(54) SEMICONDUCTOR DEVICE AND DATA PROCESSING SYSTEM WITH COORDINATED CALIBRATION AND REFRESH OPERATIONS

(71) Applicant: Renesas Electronics Corporation, Koutou-ku, Tokyo (JP)

(72) Inventors: Junkei Sato, Tokyo (JP); Nobuhiko Honda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/586,211

(22) Filed: May 3, 2017

(65) Prior Publication Data

US 2017/0236569 A1    Aug. 17, 2017

Related U.S. Application Data

(63) Continuation of application No. 14/793,407, filed on Jul. 7, 2015, now Pat. No. 9,691,449, which is a
(Continued)

(30) Foreign Application Priority Data

Jul. 29, 2010   (JP) ................................ 2010-170225

(51) Int. Cl.
*G06F 13/18* (2006.01)
*G11C 11/406* (2006.01)
(Continued)

(52) U.S. Cl.
CPC ........ *G11C 7/1072* (2013.01); *G06F 13/4234* (2013.01); *G11C 11/40611* (2013.01)

(58) Field of Classification Search
CPC ...... G06F 11/073; G06F 13/102; G06F 13/12; G06F 13/122; G06F 13/124;
(Continued)

(56) References Cited

U.S. PATENT DOCUMENTS 6,754,784 B1 * 6/2004 North ................... G06F 12/126
                                                                     711/138
2002/0040424 A1   4/2002 Kumazawa
(Continued)

FOREIGN PATENT DOCUMENTS

JP      2002-108693 A   4/2002
JP      2005-78547 A    3/2005
(Continued)

OTHER PUBLICATIONS

Extended European Search Report dated Nov. 29, 2013, in European Patent Application No. 11812196.1.
(Continued)

*Primary Examiner* — Hal W Schnee
(74) *Attorney, Agent, or Firm* — Shapiro, Gabor and Rosenberger, PLLC

(57) ABSTRACT

Provided is a memory control technique for avoiding that the issue of a refresh command and the issue of a calibration command are arranged in succession.
The memory control circuit issues a refresh command to make a request for a refresh operation based on a set refresh cycle, and issues a calibration command to make a request for a calibrating operation based on a set calibration cycle, for which the control function of suppressing the issue of the calibration command only for a given time after the issue of the refresh command, and suppressing the issue of the refresh command only for a given time after the issue of the calibration command is adopted.

16 Claims, 20 Drawing Sheets

Related U.S. Application Data continuation of application No. 13/812,834, filed as application No. PCT/JP2011/064113 on Jun. 21, 2011, now Pat. No. 9,111,632.

(51) Int. Cl.
*G11C 7/10* (2006.01)
*G06F 13/42* (2006.01)

(58) Field of Classification Search
CPC .. G06F 13/1668; G06F 13/1689; G06F 13/18; G11C 7/1072
See application file for complete search history.

(56) References Cited

U.S. PATENT DOCUMENTS

| | | | |
|---|---|---|---|
| 2002/0161992 A1* | 10/2002 | Utsumi | G06F 1/24 713/1 |
| 2003/0081483 A1 | 5/2003 | De Paor et al. | |
| 2003/0204669 A1 | 10/2003 | Ranganathan et al. | |
| 2004/0174570 A1* | 9/2004 | Plunkett | B41J 2/04505 358/3.13 |
| 2005/0047192 A1 | 3/2005 | Matsui et al. | |
| 2005/0235102 A1* | 10/2005 | Sakurai | G06F 13/1636 711/106 |
| 2006/0100806 A1* | 5/2006 | Zayas | G11B 20/10009 702/85 |
| 2006/0104137 A1 | 5/2006 | Bellows et al. | |
| 2007/0007992 A1 | 1/2007 | Bains et al. | |
| 2007/0183243 A1* | 8/2007 | Tanaka | G06F 13/1636 365/222 |
| 2008/0007319 A1 | 1/2008 | Cox | |
| 2008/0140923 A1 | 6/2008 | Bellows et al. | |
| 2008/0276112 A1 | 11/2008 | Matsui et al. | |
| 2009/0089494 A1 | 4/2009 | Koganezawa | |
| 2009/0289659 A1 | 11/2009 | Kuwahara et al. | |
| 2011/0119439 A1 | 5/2011 | Blackmon et al. | |
| 2012/0150481 A1 | 6/2012 | Cox | |

FOREIGN PATENT DOCUMENTS

| | | |
|---|---|---|
| JP | 2008-48384 A | 2/2008 |
| JP | 2009-284265 A | 12/2009 |
| JP | 2010-86415 A | 4/2010 |
| WO | WO 2010/038422 A1 | 4/2010 |

OTHER PUBLICATIONS

Office Action dated Apr. 20, 2017, in Korean Patent Application No. 10-2013-7002198.

Office Action, dated Nov. 28, 2017, in Chinese Patent Application No. 201510857505.4.

Office Action, dated Apr. 5, 2018, in Korean Patent Application No. 10-2018-7000694.

* cited by examiner

Fig.2

| Function | Abbreviation | CKE | | CS# | RAS# | CAS# | WE# | BA0 - BA2 | A13 - A15 | A12 | A10 | A0 - A9, A11 |
| --- | --- | --- | --- | --- | --- | --- | --- | --- | --- | --- | --- | --- |
| | | Previous Cycle | Current Cycle | | | | | | | | | |
| ZQ Calibration Short | ZQCS | H | H | L | H | H | L | X | X | X | L | X |

[BA=Bank Address, RA=Row Address, CA=Column Address, BC#=Burst Chop, X=Don't Care, V=Valid]

Fig.3

| Function | Abbreviation | CKE | | CS# | RAS# | CAS# | WE# | BA0 - BA2 | A13 - A15 | A12 | A10 | A0 - A9, A11 |
| --- | --- | --- | --- | --- | --- | --- | --- | --- | --- | --- | --- | --- |
| | | Previous Cycle | Current Cycle | | | | | | | | | |
| Refresh | REF | H | H | L | L | L | H | V | V | V | V | V |

[BA=Bank Address, RA=Row Address, CA=Column Address, BC#=Burst Chop, X=Don't Care, V=Valid]

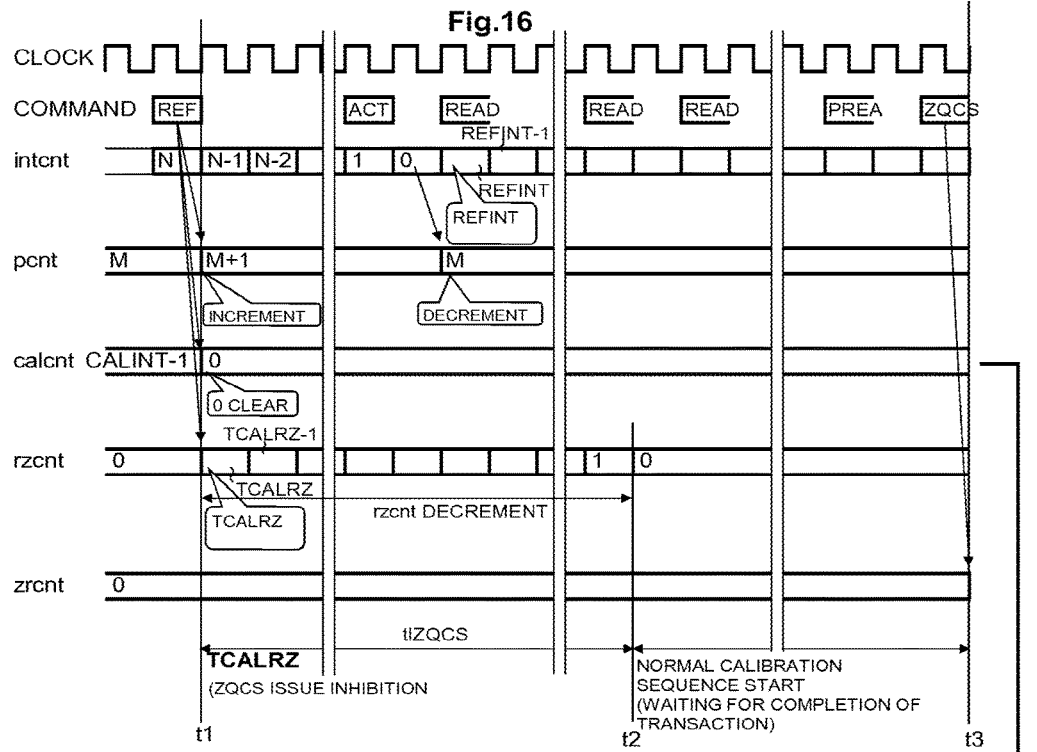
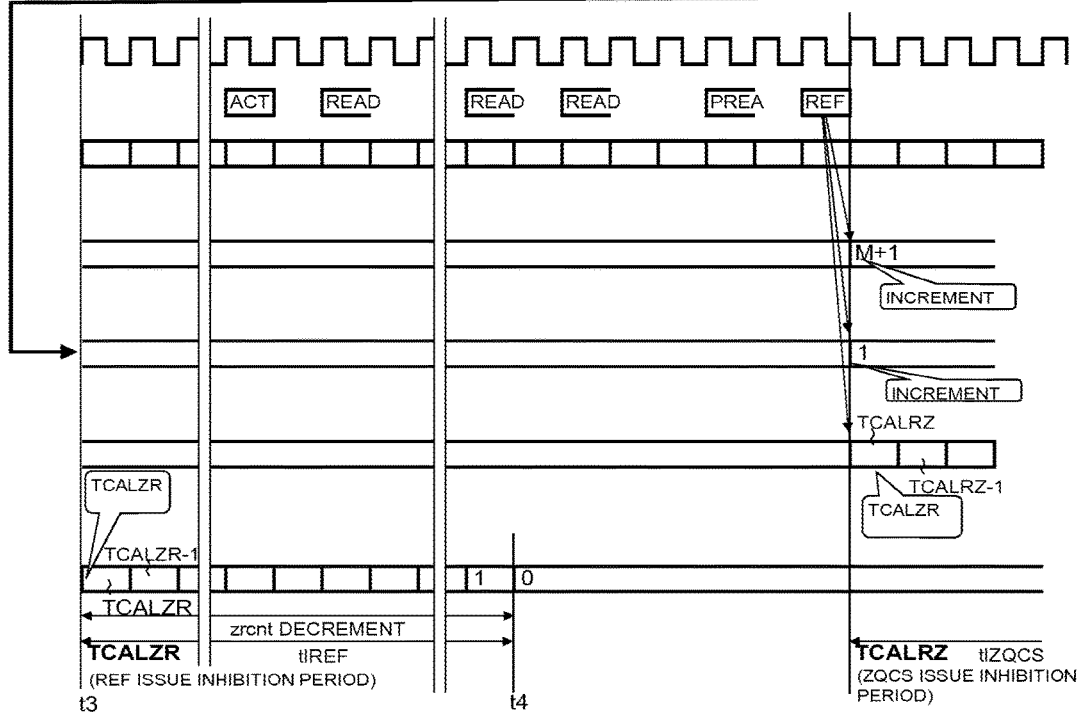
Fig.16

Fig. 17
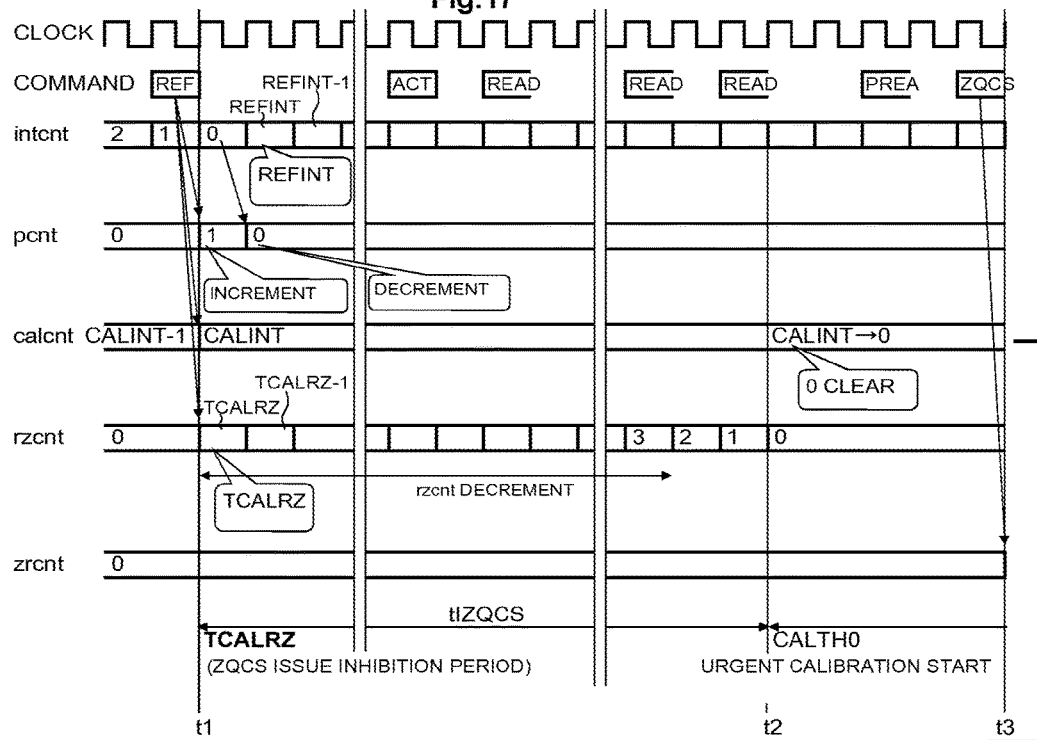
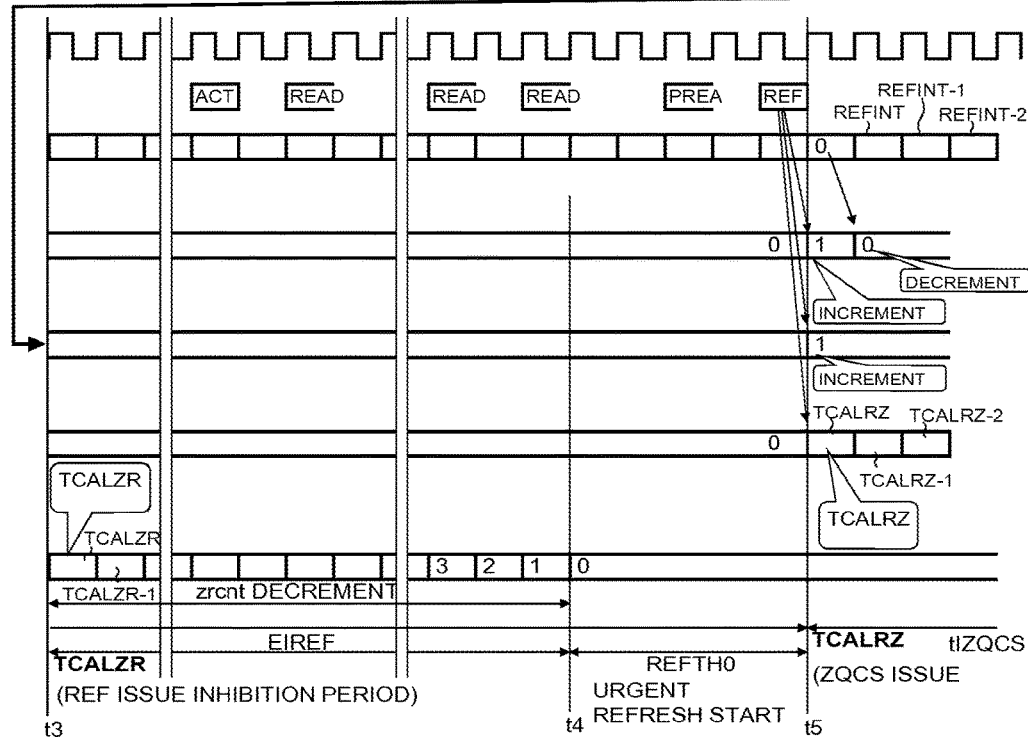

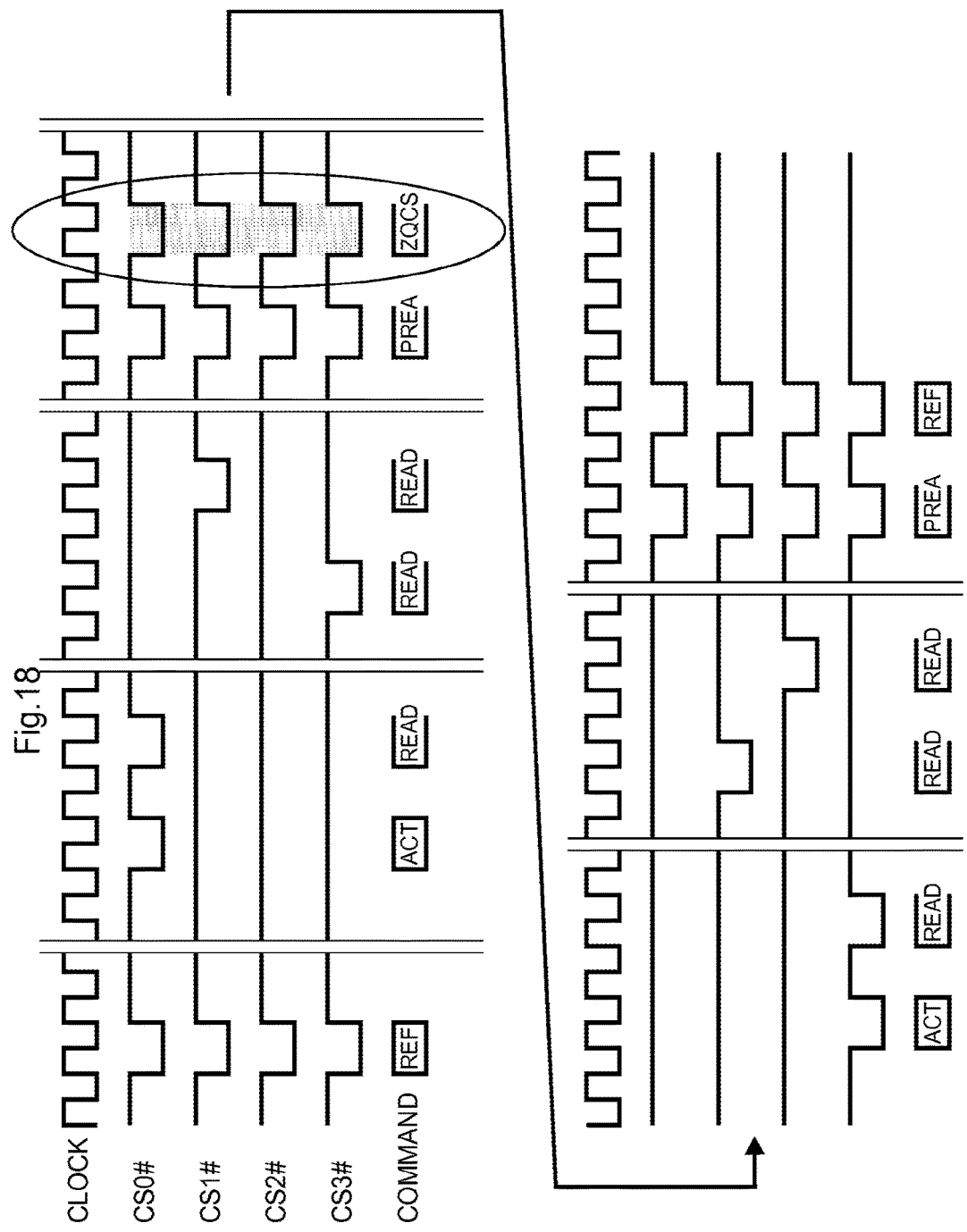

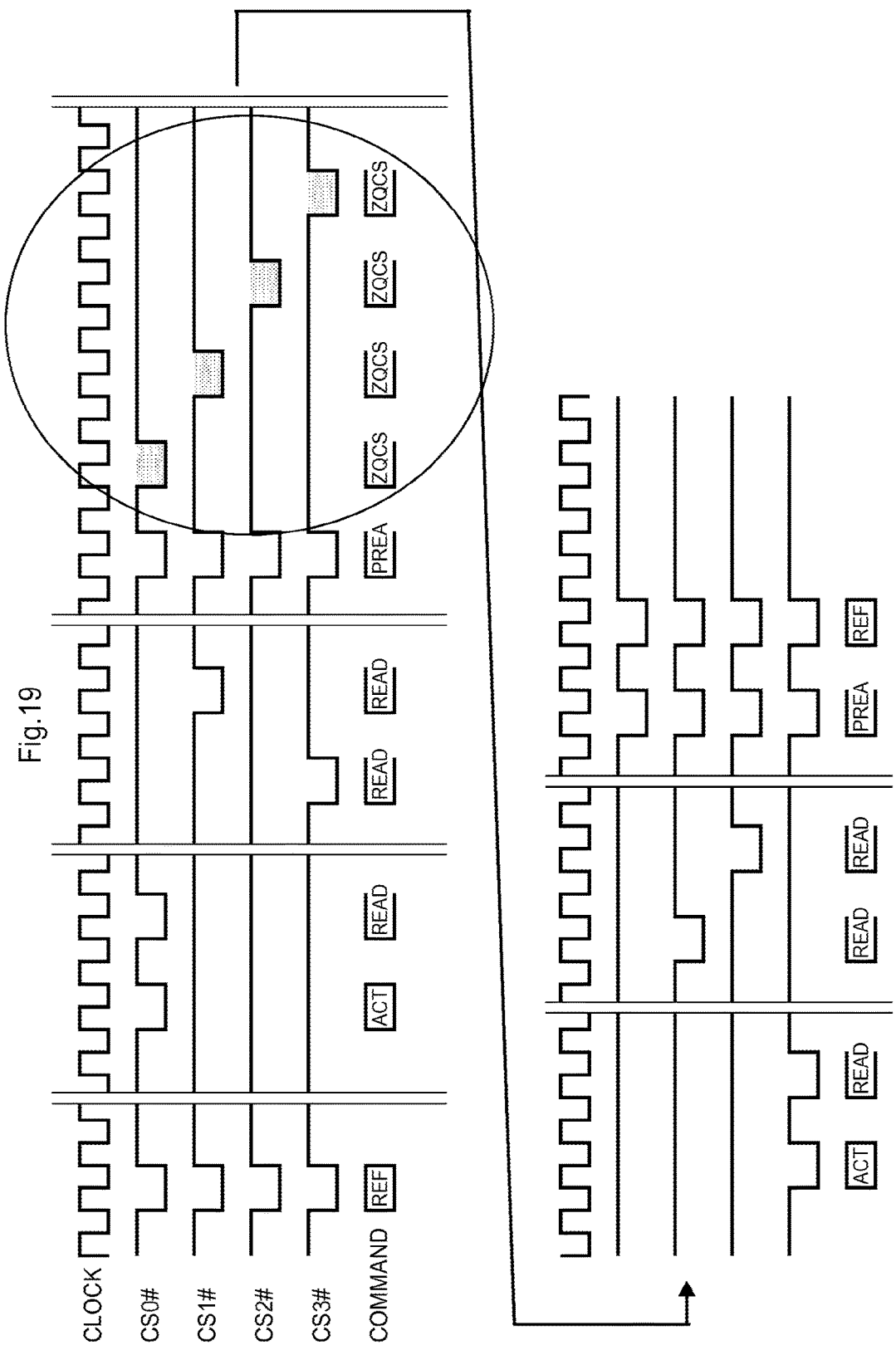

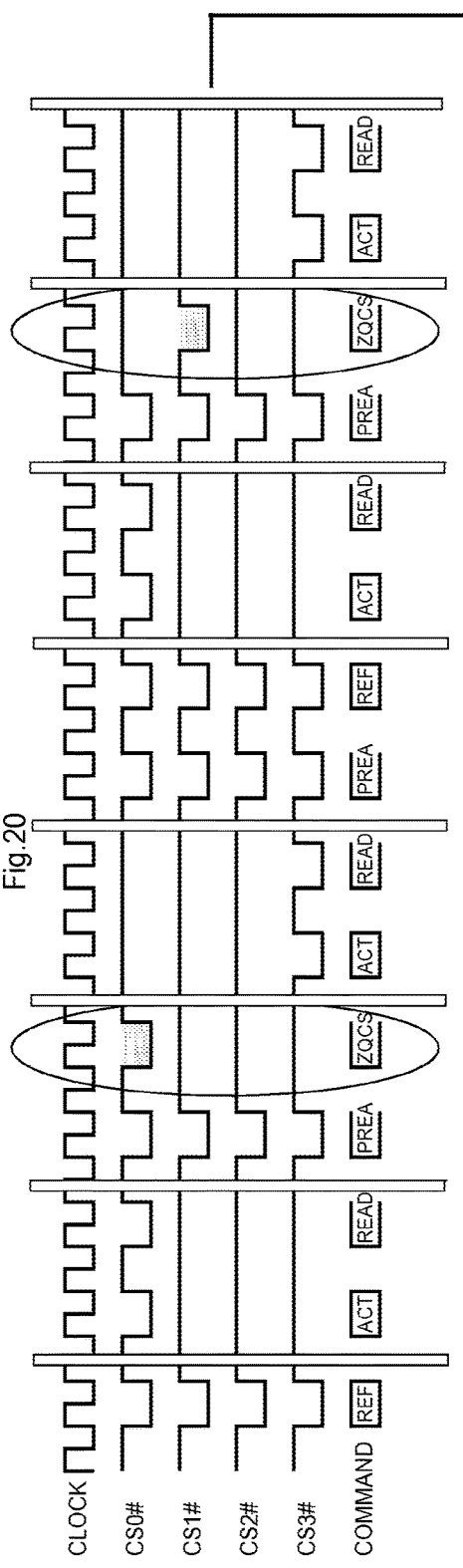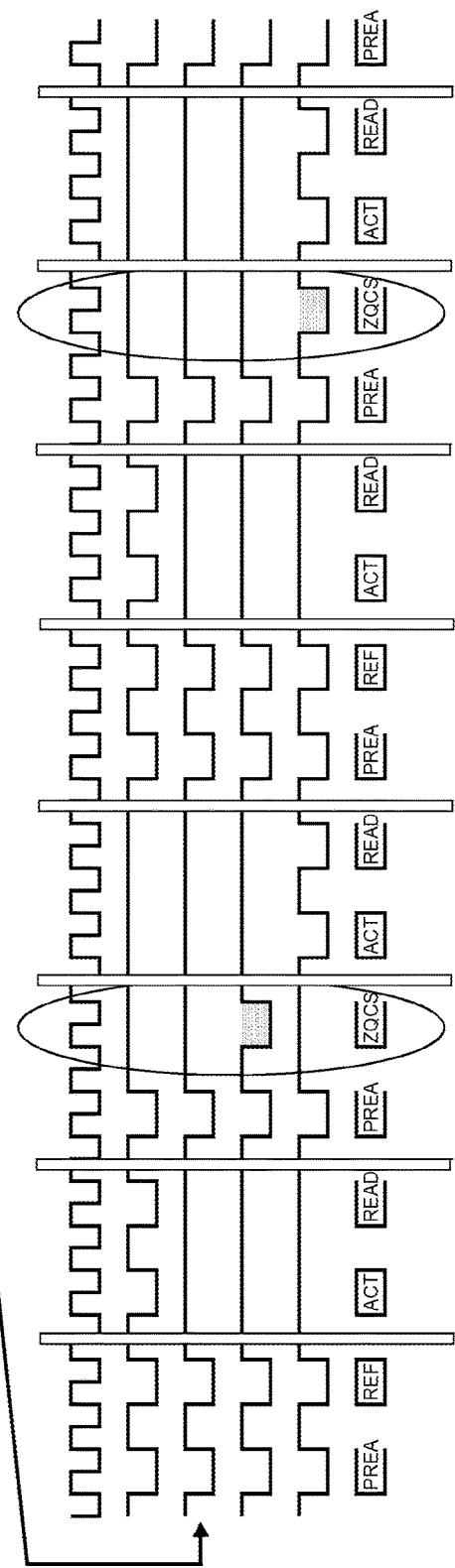

SEMICONDUCTOR DEVICE AND DATA PROCESSING SYSTEM WITH COORDINATED CALIBRATION AND REFRESH OPERATIONS

CROSS-REFERENCE TO RELATED APPLICATIONS

The Present application claims priority from Japanese application JP 2010-170225 filed on Jul. 29, 2010, the content of which is hereby incorporated by reference into this application.

TECHNICAL FIELD

The present invention relates to a memory control technique for controlling a DDR-SDRAM which is a DDR (Double Data Rate) type SDRAM (Synchronous Dynamic Random Access Memory), particularly a technique for controlling the issue of refresh and calibration commands and a technique useful in application to e.g. a microcomputer with a DDR-SDRA memory control circuit.

BACKGROUND ART

DDR-SDRAMs need a refresh operation for reproducing stored information before the leakage of accumulated capacity's electric charge information causes data inversion. Further, adopted for DDR-SDRAMs is Dynamic On Die Termination by which a termination resistance provided in a data-related external interface circuit allows signal reflection at a device end to be suppressed readily to ensure the quality of waveforms required for high-speed data transfer; the resistance value is selectable. The value of the resistance selectable in Dynamic On Die Termination (also herein referred to as Dynamic ODT, simply) must be decided in consideration of its temperature characteristic and a source voltage, and therefore the arrangement which allows a calibrating operation for correcting the resistance value in Dynamic ODT to be performed is made.

Patent Document 1 has described a memory controller which issues a command to order a calibrating operation for correcting a resistance value associated with the Dynamic ODT.

Patent Document 2 has described a calibration circuit and a correction circuit according to Dynamic ODT in DDR-SDRAM.

RELATED ART DOCUMENTS

Patent Documents

[Patent Document 1] JP-A-2008-48384
[Patent Document 2] JP-A-2009-284265

DISCLOSURE OF THE INVENTION

Problems that the Invention is to Solve

DDR-SDRSAM cannot accept an access command during a calibrating operation for correcting the resistance value according to Dynamic ODT. The reason for this is the same as why DDR-SDRSAM cannot accept an access command during a refresh operation. The refresh operation must be done once in a given time on all of memory cells in a memory cell array. Further, in order to keep the quality of signals, it is necessary to repeatedly perform the calibrating operation at intervals of a given time. The memory control circuit issues a refresh command to order DDR-SDRAM a refresh operation at given refresh intervals, and also issues a calibration command to order DDR-SDRAM a calibrating operation at given calibration intervals.

The calibrating operation and the refresh operation take a relatively long time, and therefore if the two operations come in succession, the waiting time for the issue of an access command becomes longer. As to a conventional memory control technique for DDR-SDSRAM, no measure for timing control to avoid successive issues of a refresh command and a calibration command is taken.

It is an object of the invention to provide a memory control technique for avoiding the successive issues of a refresh command and a calibration command.

The above and other objects of the invention and a novel feature thereof will become apparent from the description hereof and the accompanying drawings.

Means for Solving the Problems

Of the inventions herein disclosed, the representative one will be briefly outlined below.

A control function for suppressing the issue of a calibration command for a given time after the issue of a refresh command, and suppressing the issue of a refresh command for a given time after the issue of a calibration command is adopted for a memory control circuit which issues a refresh command to make a request for a refresh operation based on a set refresh cycle, and issues a calibration command to make a request for a calibrating operation based on a set calibration cycle.

Effects of the Invention

The effect that of the inventions herein disclosed, the representative one achieves will be briefly described below.

That is, it is possible to perform memory control so that a refresh command and a calibration command are not issued in succession.

BRIEF DESCRIPTION OF THE DRAWINGS

FIG. 2 is an explanatory drawing of a calibration command (ZQCS command).

FIG. 3 is an explanatory drawing of a refresh command (REF command).

FIG. 16 is an operation timing chart in the case of performing a normal calibrating operation.

FIG. 17 is an operation timing chart in the case of performing an urgent calibration.

FIG. 18 is an operation timing chart in a case of performing, in parallel, a calibrating operation on a plurality of SDRAMs on which the SDRAM controller selectively performs chip selection.

FIG. 19 is an operation timing chart in the case of successively executing, in turn, a calibrating operation on a plurality of SDRAMs on which the SDRAM controller selectively performs chip selection.

FIG. 20 is an operation timing chart in the case of successively performing a calibrating operation according to a round-robin algorithm on a plurality of SDRAMs, on a plurality of SDRAMs on which the SDRAM controller selectively performs chip selection.

EXPLANATION OF REFERENCE NUMERALS

Figure 1:
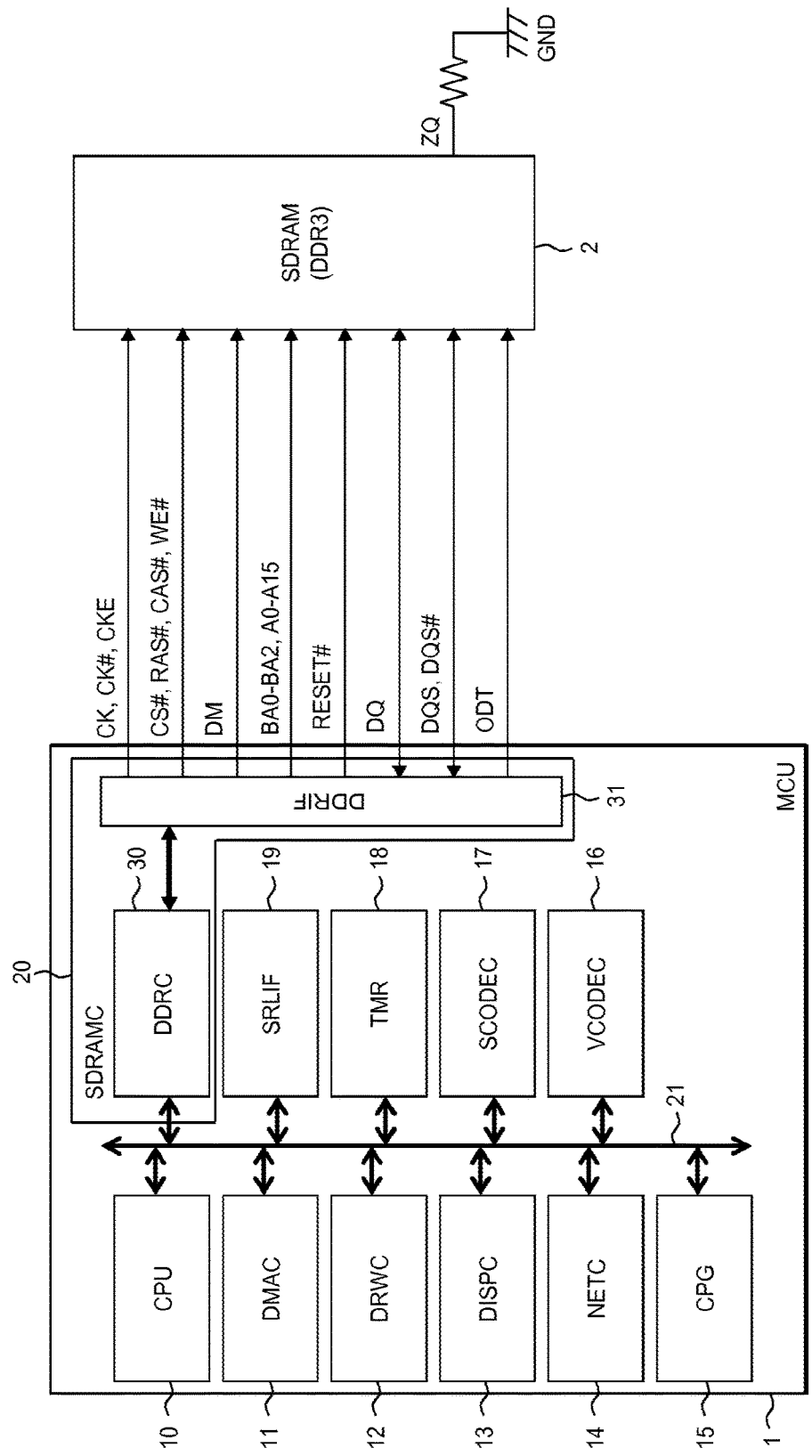
FIG. 1 is a block diagram of a data processing system according to an embodiment of the invention.

1 Microcomputer (MCU)
2 SDRAM
10 CPU
11 DMAC
12 Image-drawing controller (DRWC)
13 Display controller (DISPC)
14 Network controller (NETC)
15 Clock pulse generator (CPG)
16 Image-drawing codec (VCODEC)
17 Audio codec (SCODEC)
18 Timer (TMR)
19 Serial interface (SRLIF)
20 SDRAM controller (SDRAMC) as a memory control circuit
21 Internal bus (IBUS)
CK, CK# Complementary clock signal
CKE Clock enable signal
DQ Input/output data
DQS, DQS# Data strobe signal
CS# Chip select signal
RAS# Row address strobe signal
CAS# Column address strobe signal
WE # Write enable signal
30 DDR interface control unit (DDRC)
31 DDR interface unit (DDRIF)
32 Request control unit
33 Response control unit
34 Register unit
35 Device control unit
REFINT Refresh cycle register
REFPMAX Maximum-surplus-number-of-times register
CALINT Calibration cycle register
TCALRZ First suppression period register
TCALZR Second suppression period register
REFTH Forcible threshold register as second threshold
intcnt Refresh cycle counter
pcnt Surplus-number-of-times counter
calcnt Calibration cycle counter
rzcnt First suppression period counter
zrcnt Second suppression period counter
Register REFTH0 Urgent threshold as first threshold
CALTH0 Calibration threshold register

BEST MODE FOR CARRYING OUT THE INVENTION

1. Summary of the Embodiments

The preferred embodiments of the invention herein disclosed will be outlined first. Here, the reference characters or numerals for reference to the drawings, which are accompanied with paired round brackets, only exemplify what the concepts of constituents referred to by the characters or numerals contain.

[1]<Suppression of Successive Issues of Refresh Command and Calibration Command>

A semiconductor device (1) according to a preferred embodiment of the invention has: a memory control circuit (20) for controlling a DDR type SDRAM (2(2_a, 2_b)); and access-requesting circuits (10-14) for making a request for an access to the SDRAM to the memory control circuit. The memory control circuit issues an access command (ACT, READ) for responding to an access request from the access-requesting circuit, a refresh command (REF) to make a request for a refresh operation for reproducing stored information of the SDRAM based on a set refresh cycle, and a calibration command (ZQCS) to make a request for a calibrating operation for correcting an internal state of the SDRAM based on a set calibration cycle, suppresses the issue of the calibration command for a given time after the issue of the refresh command, and suppresses the issue of the refresh command for a given time after the issue of the calibration command.

This makes possible to avoid the successive issues of the refresh command and the calibration command, and to prevent the reduction in access speed owing to the commands issued in succession.

[2]<rzcnt, zrcnt, TCALRZ, TCALZR>

In the semiconductor device of [1], the memory control circuit includes: a first suppression period register (TCALRZ) for specifying a period during which the issue of the calibration command is suppressed after the issue of the refresh command; a first suppression period counter (rzcnt) for counting a period set on the first suppression period register; a second suppression period register (TCALZR) for specifying a period during which the issue of the refresh command is suppressed after the issue of the calibration command; and a second suppression period counter (zrcnt) for counting a period set on the second suppression period register. The memory control circuit restrains the issue of the refresh command until a count value of the first suppression period counter exceeds a period set on the first suppression period register after the issue of the calibration command, and restrains the issue of the calibration command until a count value of the second suppression period counter exceeds a period set on the second suppression period register after the issue of the refresh command.

A restraint period can be set on the suppression period register programmably.

[3]<Urgent Refresh According to Refresh Cycle Count Value>

In the semiconductor device of [2], the memory control circuit has: a refresh cycle register (REFINT) on which a refresh cycle is set; and a refresh cycle counter (intcnt) for counting a period of the refresh cycle set on the refresh cycle register. The memory control circuit issues the refresh command even if an access in response to an access request from the access-requesting circuit has not been completed after a count value of the refresh cycle counter reached a first threshold (REFTH0).

It is possible to institute a measure at the time of urgency with a refresh halt period elongated. In case that the refresh command has been issued urgently, it is sufficient for the memory control circuit to control the period interrupted by the issue of the refresh command as a weighted cycle in memory access.

[4]<Forcible Refresh According to Refresh Cycle Count Value>

In the semiconductor device of [3], the memory control circuit issues the refresh command if an access in response to an access request from the access-requesting circuit has been completed after the count value of the refresh cycle counter reached a second threshold (REFTH) prior to the first threshold.

In a case where the refresh operation has a low urgency, the successiveness of SDRAM access in response to an access request from the access-requesting circuit is assured, whereby the deterioration of the access performance is prevented.

[5]<Whether or Not to Perform a Preceding Refresh According to the Count Value of the Surplus Number of Times>

In the semiconductor device of [4], the memory control circuit has a maximum-surplus-number-of-times register (REFPMAX) on which the surplus number of refresh command issues is set, and a surplus-number-of-times counter (pcnt) operable to increment by one for each issue of the refresh command, and decrement by one for each expiration of refresh cycle period counting by the refresh cycle counter. In this case, the memory control circuit issues the refresh command if an access in response to an access request from the access-requesting circuit has been completed until the count value of the refresh cycle counter reaches the second threshold on condition that a count value of the surplus-number-of-times counter has not reached a set value of the maximum-surplus-number-of-times register.

Performing the refresh operation with no access to the SDRAM at any time not only causes an operation of no use, but also results in the reduction in the occasion for the access-requesting circuit to access to the SDRAM. Such disadvantages can be prevented from becoming reality by consideration of the count value of the surplus number of times. In short, in the case of the refresh operation with a lower urgency, it is possible to make an access to the SDRAM from the access-requesting circuit a higher priority than the refresh operation.

[6]<Urgent Calibration According to Calibration Cycle Count Value>

In the semiconductor device of [3], the memory control circuit has a calibration cycle register (CALINT) on which a calibration cycle is set, and a calibration cycle counter (calcnt) for counting a period of the calibration cycle set on the calibration cycle register. In this case, the memory control circuit issues the calibration command even if an access in response to an access request from the access-requesting circuit has not been completed on condition that the count value of the calibration cycle counter has reached a value specified by the calibration cycle register, and the value of the refresh cycle counter has reached a calibration threshold (CALTH0).

It is possible to institute a measure at the time of urgency with a refresh halt period elongated. In the case of issuing the calibration command urgently, it is sufficient for the memory control circuit to control the period interrupted by the issue of the calibration command as a weighted cycle in memory access.

[7]<Normal Calibration According to Calibration Cycle Count Value>

In the semiconductor device of [6], the memory control circuit issues the calibration command if an access in response to an access request from the access-requesting circuit has been completed on condition that the count value of the calibration cycle counter has reached a value specified by the calibration cycle register, and the value of the refresh cycle counter has not reached the calibration threshold.

In a case where the calibrating operation has a low urgency, the successiveness of SDRAM access in response to an access request from the access-requesting circuit is assured, whereby the deterioration of the access performance is prevented.

[8]<Control of Calibration Cycle Counter>

In the semiconductor device of [7], the calibration cycle counter performs a counting operation each issue of a refresh command, and is returned to its initial value in the case that the count value reaches a set value of the calibration cycle register.

The control of the counting operation of the calibration cycle counter is facilitated on condition that the intervals to perform the calibrating operation at are longer than those to perform the refresh operation at. Particularly, the control is excellent in the harmonization with the operation of judging whether to issue the calibration command urgently as described above based on whether or not the value of the refresh cycle counter has reached the calibration threshold (CALTH0).

[9]<Suppression of Successive Issues of Refresh Command and Calibration Command>

A data processing system according to another embodiment of the invention has a DDR type SDRAM ($2(2a,2b)$), and a microcomputer (1) connected to the SDRAM. The microcomputer has a memory control circuit (20) for controlling the SDRAM, and access-requesting circuits (10-14) for making a request for an access to the SDRAM to the memory control circuit. The memory control circuit issues an access command to respond to an access request from the access-requesting circuit, a refresh command to make a request for a refresh operation for reproducing stored information of the SDRAM based on a set refresh cycle, and a calibration command to make a request for a calibrating operation for correcting an internal state of the SDRAM based on a set calibration cycle, suppresses the issue of the calibration command for a given time after the issue of the refresh command, and suppresses the issue of the refresh command for a given time after the issue of the calibration command.

Thus, it becomes possible to avoid that the issue of the refresh command and the issue of the calibration command are arranged in succession, whereby the reduction in access speed for an SRAM owing to the succession of the commands can be prevented.

[10]<On-Chip CPU>

The data processing system according to [9] has a CPU (Central Processing Unit) as one of the access-requesting circuit.

[11]<rzcnt, zrcnt>

In the data processing system of [9], the memory control circuit includes: a first suppression period counter for counting a first suppression period specified by the CPU; and a second suppression period counter for counting a second suppression period specified by the CPU. In this case, the memory control circuit restrains the issue of the refresh command until the count value of the first suppression period counter exceeds the first suppression period after the issue of the calibration command, and restrains the issue of the calibration command until a count value of the second suppression period counter exceeds the second suppression period after the issue of the refresh command.

Using the CPU, the restraint period can be specified programmably.

[12]<Urgent Refresh According to Refresh Cycle Count Value>

In the data processing system of [11], the memory control circuit has a refresh cycle counter for counting the period of a refresh cycle specified by the CPU. In this case, the memory control circuit issues the refresh command even if an access in response to an access request from the access-requesting circuit has not been completed after arrival of the count value of the refresh cycle counter at a first threshold.

It is possible to institute a measure at the time of urgency with a refresh halt period elongated. In the case of issuing the refresh command urgently, it is sufficient for the memory control circuit to control the period interrupted by the issue of the refresh command as a weighted cycle in memory access.

[13]<Forcible Refresh According to Refresh Cycle Count Value>

In the data processing system of [12], the memory control circuit issues the refresh command if an access in response to an access request from the access-requesting circuit has been completed after arrival of the count value of the refresh cycle counter at a second threshold prior to the first threshold.

With the refresh operation having a low urgency, the successiveness of SDRAM access in response to an access request from the access-requesting circuit is assured, whereby the deterioration of the access performance is prevented.

[14]<Whether or Not to Perform a Preceding Refresh According to the Count Value of the Surplus Number of Times>

In the data processing system of [13], the memory control circuit has a maximum-surplus-number-of-times register on which a surplus number of refresh command issues is set, and a surplus-number-of-times counter operable to increment by one for each issue of the refresh command, and decrement by one for each expiration of refresh cycle period counting by the refresh cycle counter. In this case, the memory control circuit issues the refresh command if an access in response to an access request from the access-requesting circuit has been completed until the count value of the refresh cycle counter reaches the second threshold on condition that the count value of the surplus-number-of-times counter has not reached a set value of the maximum-surplus-number-of-times register.

Performing the refresh operation with no access to the SDRAM at any time not only causes an operation of no use, but also results in the reduction in the occasion for the access-requesting circuit to access to the SDRAM. Such disadvantages can be prevented from becoming reality by consideration of the count value of the surplus number of times. In short, in the case of the refresh operation with a lower urgency, it is possible to make an access to the SDRAM from the access-requesting circuit a higher priority than the refresh operation.

[15]<Urgent Calibration According to Calibration Cycle Count Value>

In the data processing system of [12], the memory control circuit has a calibration cycle counter for counting the period of a calibration cycle specified by the CPU. In this case, the memory control circuit issues the calibration command even if an access in response to an access request from the access-requesting circuit has not been completed on condition that the count value of the calibration cycle counter has reached the calibration cycle period, and the value of the refresh cycle counter has reached a calibration threshold.

Thus, it is possible to institute a measure at the time of urgency with a refresh halt period elongated. In the case of issuing the calibration command urgently, it is sufficient for the memory control circuit to control the period interrupted by the issue of the calibration command as a weighted cycle in memory access.

[16]<Normal Calibration According to Calibration Cycle Count Value>

In the data processing system of [15], the memory control circuit issues the calibration command if an access in response to an access request from the access-requesting circuit has been completed on condition that the count value of the calibration cycle counter has reached the calibration cycle period, and the value of the refresh cycle counter has not reached the calibration threshold.

With the refresh operation having a low urgency, the successiveness of SDRAM access in response to an access request from the access-requesting circuit is assured, whereby the deterioration of the access performance is prevented.

[17]<Control of Calibration Cycle Counter>

In the data processing system of [16], the calibration cycle counter performs a counting operation for each issue of the refresh command, and is returned to its initial value on arrival of the count value at a calibration cycle period.

The control of the counting operation of the calibration cycle counter is facilitated on condition that the intervals to perform the calibrating operation at are longer than those to perform the refresh operation at. Particularly, the control is excellent in the harmonization with the operation of judging whether to issue the calibration command urgently as described above based on whether or not the value of the refresh cycle counter has reached the calibration threshold (CALTH0).

2. Further Detailed Description of the Embodiments

The embodiments will be described further in detail.

<<Data Processing System>>

FIG. 1 shows a data processing system according to an embodiment of the invention. The data processing system includes a microcomputer (MCU) 1, and an SDRAM 2 which is connected with the microcomputer, and takes a form of DDR3. The MCU 1 and SDRAM 2 are composed of separate semiconductor devices respectively. Although no special restriction is intended, they are formed on a semiconductor substrate such as a monocrystalline silicon bulk by a CMOS integrated circuit manufacturing technology.

Although no special restriction is intended, the microcomputer 1 has a CPU 10, a DMAC 11, an image-drawing controller (DRWC) 12, a display controller (DISPC) 13, a network controller (NETC) 14, a clock pulse generator (CPG) 15, an image-drawing codec (VCODEC) 16, an audio codec (SCODEC) 17, a timer (TMR) 18, a serial interface (SRLIF) 19, and an SDRAM controller (SDRAMC) 20 as a memory control circuit; these circuit modules input/output data and others through an internal bus (IBUS) 21.

The CPU 10 executes a program stored in a program region of the SDRAM 2. The DMAC 11 controls data transfer to/from SDRAM 2, etc. according to a data transfer condition set by the CPU. The image-drawing controller 12 controls the drawing of image data on a frame buffer region of SDRAM 2. The display controller 13 controls the display of image data drawn on the frame buffer region of SDRAM 2. The network controller 14 performs communication control for sending transmit data in a communication buffer region of the SDRAM 2, or storing receive data in the communication buffer region according to a network protocol specified by the CPU 10. The SDRAM controller 20 controls the interface with the SDRAM 2 in response to access requests from the CPU 10, the DMAC11, the image-drawing controller 12, the display controller 13, and the network controller 14 as access-requesting circuits.

Although no special restriction is intended, the internal bus 21 is composed of split transaction buses. The circuit module (initiator) such as the CPU 10 which requests an access outputs a request packet to make an access request. The circuit module (target) such as the SDRAM controller 20 connected with the SDRAM 2 to be accessed returns a result of response to the access request as a response packet to the initiator. The arbitration between packets which is competitive with the routing of a request packet and a response packet between the initiator and target is performed by a router whose diagrammatic representation is omitted.

The SDRAM 2 performs write data input, and read data output in synchronization with both of a rising edge and a falling edge of complementary clock signals CK and CK# (the sign, # means that the signal is a phase inversion signal or a row enable signal). The clock signals CK and CK# are made effective, provided that a clock enable signal CKE is activated. Input/output data of a plurality of bits are typified by DQ, and the determination on read and write data DQ is shown by data strobe signals DQS and DQS#. The operations such as write, read, refresh, and Dynamic On Die Termination are ordered by a command determined by a combination of level signals such as a chip select signal CS#, a row address strobe signal RAS#, a column address strobe signal CAS#, and a write enable signal WE#. BA0-BA2 represent bank select signals of memory banks constituting memory arrays having a large number of dynamic type memory cells arranged in a matrix form, and A0-A15 represent an in-bank address signals. DM is a data mask signal for masking unit of parallel data; RESET# is a reset signal for the SDRAM 2; ODT is a direction signal for directing whether or not a termination resistance according to On Die Termination should be connected to a data-related circuit. Although no special restriction is intended, the data-related circuit means an input/output interface circuit of data DQ and data strobe signals DQS and DQS#. ZQ connected between the SDRAM 2 and ground GND is a resistance element used as the basis for correction by a correction circuit which corrects the resistance value of a termination resistance according to Dynamic On Die Termination.

The SDRAM controller 20 performs the input/output of the above signals CK, CK#, CKE, CS#, RAS#, CAS#, WE#, DM, BA0-BA2, A0-A15, RESET#, DQ, DQS, DQS#, and ODT to/from the SDRAM 2.

The detailed description on the details of the structure of the SDRAM 2 is omitted here because it is not directly connected to the invention. The invention relates to a refresh operation in the SDRAM 2, and a calibrating operation for correcting the resistance value of a termination resistance according to Dynamic On Die Termination, and therefore commands to order both the operations will be described concretely.

As exemplified in FIG. 2, the calibration command (ZQCS command) is directed by CS#=L (Low level), RAS#=H, CAS#=H (High level), WE#=L, and A10=L; other signal values may be arbitrary. In the case that the SDRAM controller 20 issues a calibration command to the SDRAM 2, the SDRAM 2 corrects the value of the data-output-related termination resistance to the temperature and the source voltage with respect to the resistance value of the external resistance ZQ.

The refresh command (REF command) as the so-called Auto Refresh is directed by CS#=L, RAS#=L, CAS#=L, and WE#=H, as shown in FIG. 3. In the case that the SDRAM controller 20 issues a refresh command to the SDRAM 2, the SDRAM 2 performs a word line-select operation, and a sense amplifying operation of electric charge information read out onto complementary bit lines by it, and reproduces stored information that the dynamic type memory cell holds.

The connection form of the SDRAM controller 20 and the SDRAM 2 is not limited to a structure such that one SDRAM 2 is used as in FIG. 1. As exemplified in FIG. 4, a connection form such that data input/output terminals of two SDRAMs 2_a and 2_b are connected with corresponding data input/output terminals of the SDRAM controller 20 in common, and operations on the two SDRAMs 2_a and 2_b are separately selected by different chip select signals CS0# and CS1#, and different clock enable signals CKE#0 and CKE#1, and different On Die Termination signals ODT#0 and ODT#1 may be adopted, for example. In this case, other signals CK, CK#, RAS#, CAS#, WE DM, RESET#, DQS, and DQS# may be used for the two SDRAMs 2a and 2_b in common. In addition, as exemplified in FIG. 5, a connection form such that the two SDRAMs 2_a and 2_b are arranged to work in parallel by dividing data input/output terminals of the two SDRAMs 2_a and 2_b between the high-order side data input/output terminals of the SDRAM controller 20 and low-order side data input/output terminals, and likewise connecting data strobe signals to the two SDRAMs 2_a and 2_b separately on the high-order side and the low-order side may be adopted, for example. In this case, other signals, CS#, clock enable signals CKE#, ODT#, CK, CK#, RAS#, CAS#, WE#, DM, and RESET# are used for the two SDRAMs 2_a and 2_b in common.

Figure 4:
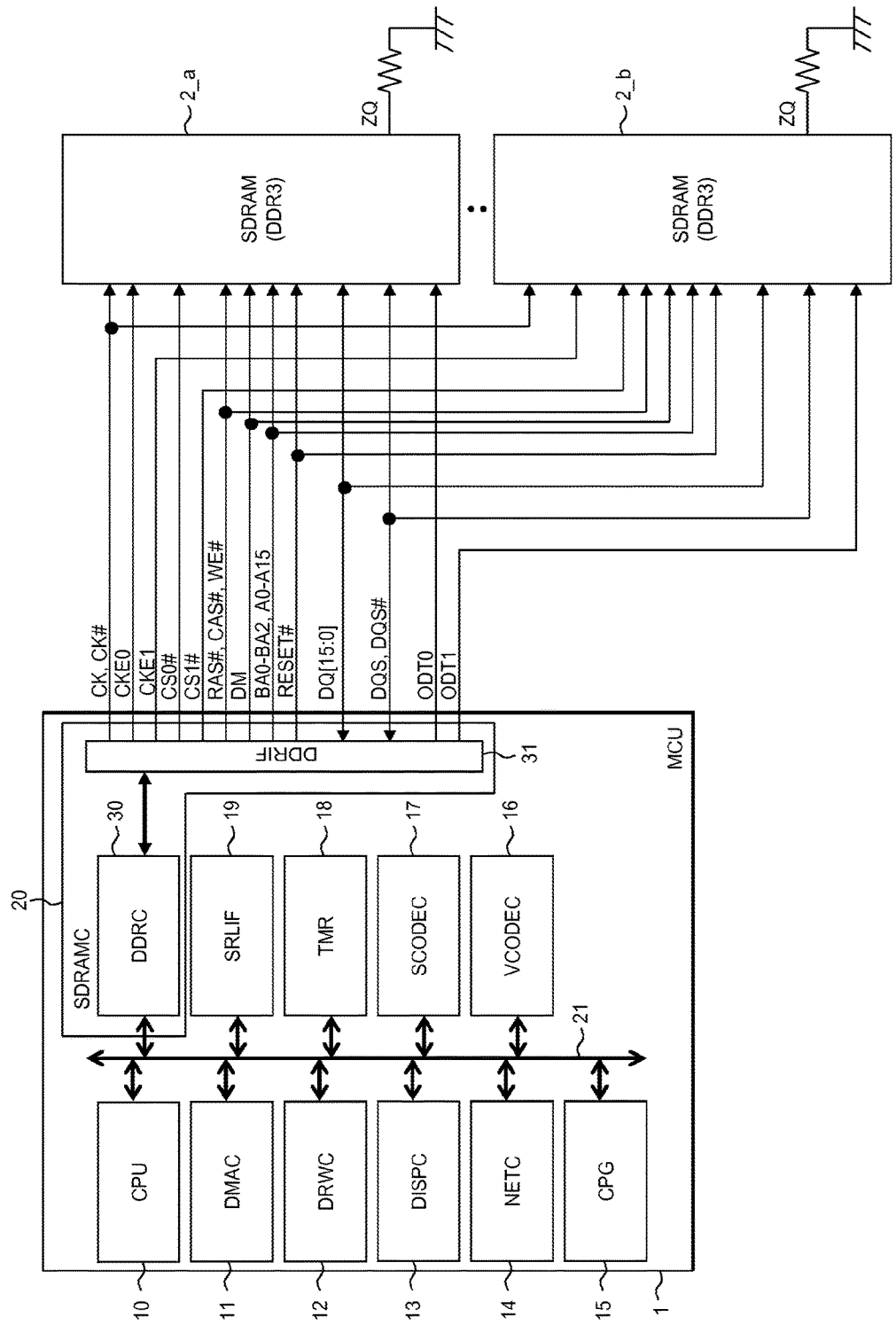
FIG. 4 is a block diagram of a data processing system for which a structure such that data input/output terminals of two SDRAMs are connected with corresponding data input/output terminals of the SDRAM controller in common is adopted as a connection form of the SDRAM controller and SDRAMs.
Figure 5:
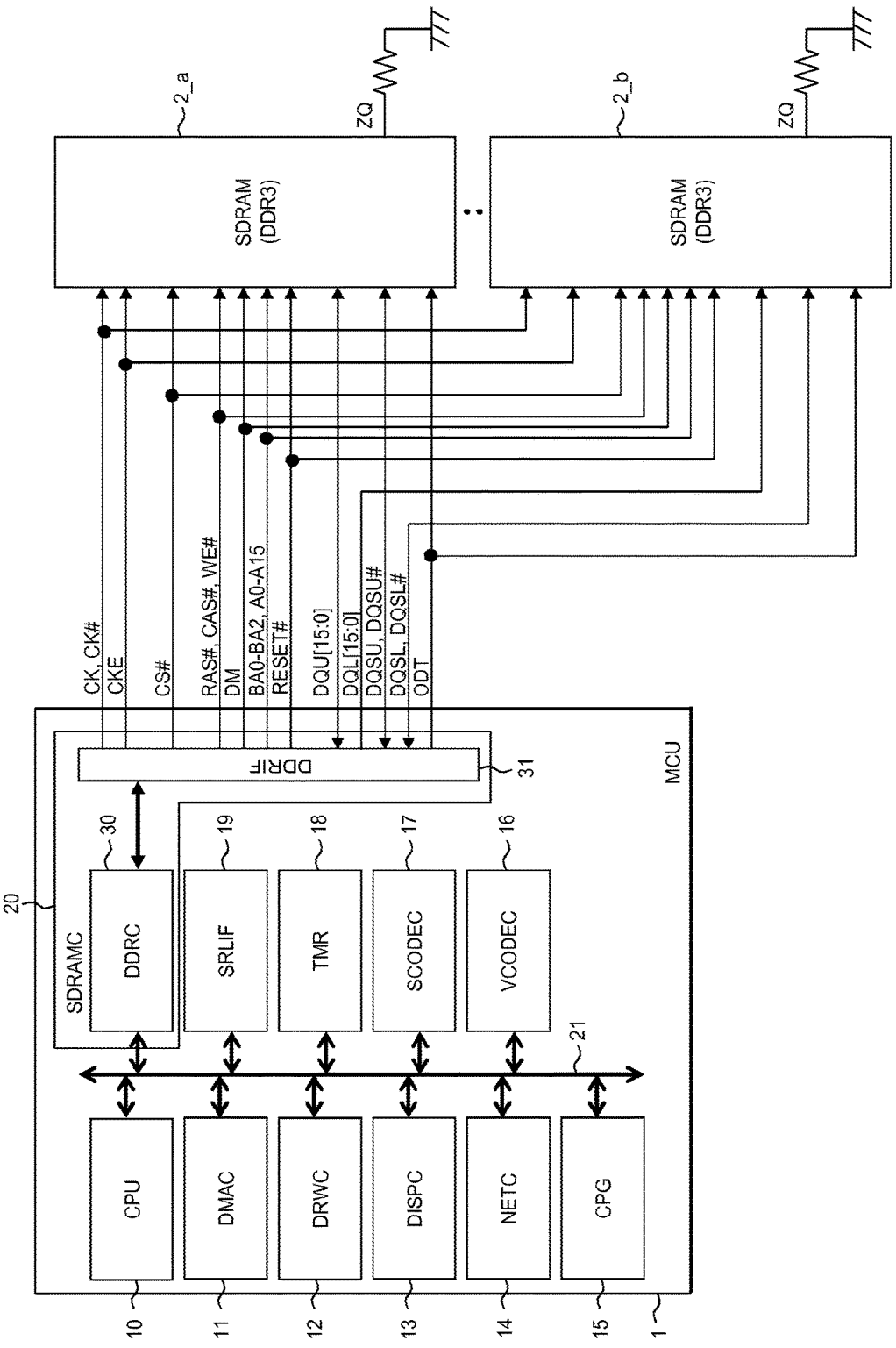
FIG. 5 is a block diagram of a data processing system for which a connection form such that two SDRAMs are arranged to work in parallel by dividing data input/output terminals of two SDRAMs between high-order side data input/output terminals and low-order side data input/output terminals of an SDRAM controller, and likewise connecting data strobe signals to the two SDRAMs separately on the high-order side and the low-order side is adopted.

Even when the connection form of the SDRAM 2 to the SDRAM controller 20 is any of the forms of FIGS. 1, 4 and 5, there is no difference in the fresh command and the calibration command that the SDRAM controller 20 issues. This is because the SDRAM controller 20 is required to complete a refresh at given intervals on all of SDRAMs connected thereto, and to correct the influence of fluctuations in the temperature and source voltage on the termination resistance according to Dynamic On Die Termination at given intervals.

Figure 6:
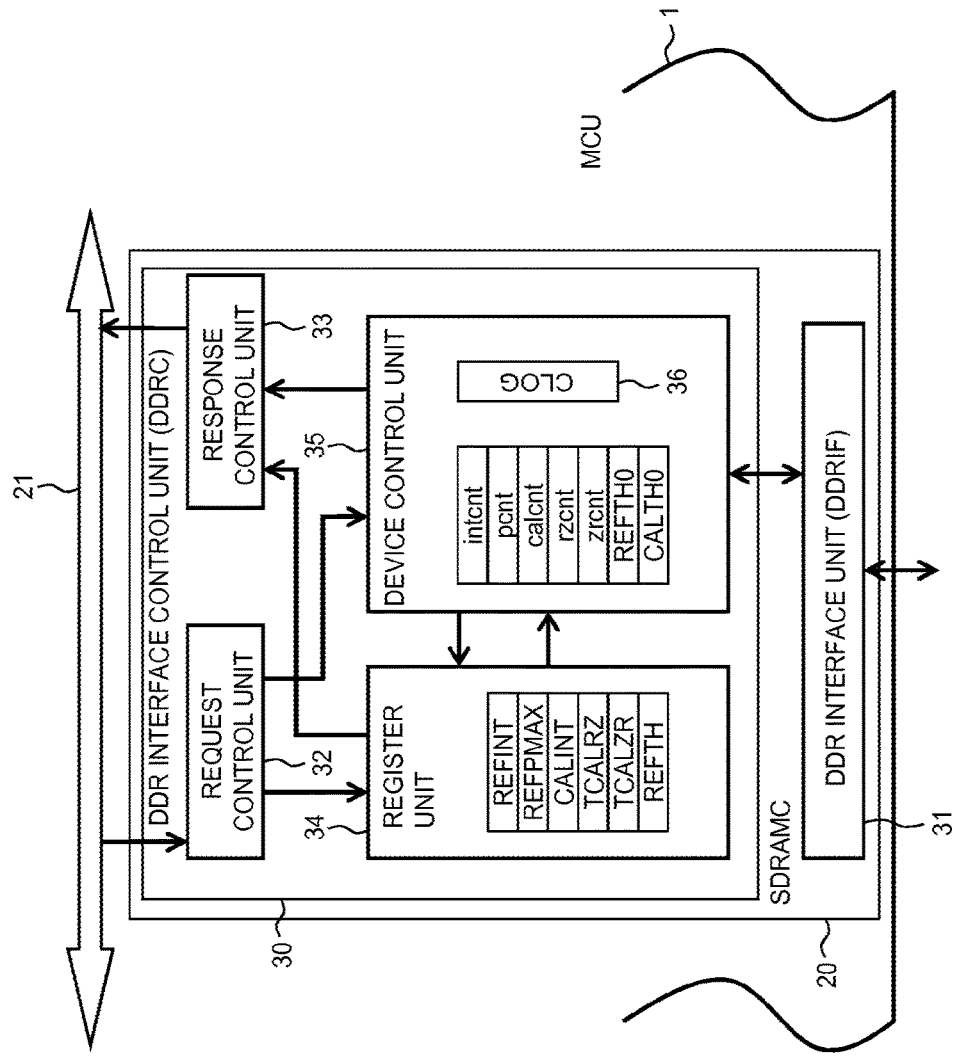
FIG. 6 is a block diagram showing a concrete example of the SDRAM controller.

FIG. 6 shows a concrete example of the SDRAM controller 20. The SDRAM controller 20 includes a DDR interface control unit (DDRC) 30 and a DDR interface unit (DDRIF) 31. The DDR interface control unit 30 includes a request control unit 32, a response control unit 33, a register unit 34, and a device control unit 35. The request control unit 32 disassembles a request packet provided through the internal bus 21 to gain instructions including a memory read, a memory write, a register read, and a register write, write data, and the like. The SDRAM controller 20 has, in the register 34, a plurality of registers on which the CPU 10 performs initial setting of control data necessary for SDRAM control, which is to be described later. The device control circuit 35 has an arithmetic circuit such as a counter, the detail of which is to be described later, and a control logic 36, produces a control command according to an instruction provided by the request control unit 32, and refers to, on an as-needed basis, control data that the register unit 34 holds in producing the control command; a control command for register access is provided to the register unit 34, and a control command for memory access is provided to the DDR interface unit 31.

The DDR interface unit 31 generates control signals such as RAS#, CAS#, WE#, DQS, DQS#, and CKE# with a timing such that the generation is synchronized with the clock signals CK and CK# according to the control command so provided in order to control the SDRAM 2 and in the case of a read operation, receives read data DQ output by the SDRAM 2 and returns it to the device control circuit 35. In the case of a write operation, the DDR interface unit 31 supplies the SDRAM 2 with write data. In the case of a refresh operation, it provides a refresh command to the SDRAM 2, and in the case of a calibrating operation, it provides a calibration command to the SDRAM 2.

The response control unit 33 produces a response packet from access results of register access and memory access, and specifies an initiator of an access request requester (one of access-requesting circuits including CPU) to output a response packet to the internal bus 21. A response packet in response to a read operation includes read data, and a response packet in response to a write operation includes a write completion notice.

The device control unit 35 issues a control command for each instruction included in a request packet. For instance, in the case of receiving a request packet to make a request for 64-byte successive data access to the SDRAM 2, the device control unit 35 produces a control command for a 64-byte burst access. In case that an SDRAM operation having a higher priority is put in the course of SDRAM access in response to the control command, the device control unit 35 can manage the access process of the interrupted SDRAM access, and resume the interrupted SDRAM access operation after the SDRAM operation of the higher priority has been finished. The weight control like this has been already performed previously, and therefore the further detailed description is omitted.

<<Refresh and Calibration Control Function>>

The function of the SDRAM controller 20 controlling the issue of a refresh command to SDRAM, and the function of controlling the issue of a calibration command will be described below in detail.

The register unit 34 has, as registers to set in control data for controlling the issue of a refresh command and a calibration command, a refresh cycle register REFINT, a maximum-surplus-number-of-times register REFPMAX, a calibration cycle register CALINT, and a first suppression period register TCALRZ, a second suppression period register TCALZR, and as a second threshold, a forcible threshold register REFTH; those registers are arranged so that the CPU 10 can set a required value thereon programmably.

The device control unit 35 has, as arithmetic circuits for controlling the issue of a refresh command and a calibration command, a refresh cycle counter intcnt, a surplus-number-of-times counter pcnt, a calibration cycle counter calcnt, a first suppression period counter rzcnt, and a second suppression period counter zrcnt, and an urgent threshold register REFTH0 as a first threshold, and a calibration threshold register CALTH0.

On the refresh cycle register REFINT, a refresh cycle which is an average interval of refresh operations is set. The refresh cycle counter intcnt counts a period of the refresh cycle set on the refresh cycle register REFINT. Specifically, this refresh cycle counter intcnt executes the down counting at every clock, and in the case that its count value reaches 0, it reloads the value of the refresh cycle register REFINT and continues the down counting.

On the maximum-surplus-number-of-times register REFPMAX, the surplus number of issues of the refresh command is set as the number of times of preceding refresh. The surplus-number-of-times counter pcnt is incremented by one for each issue of the refresh command, and is decremented by one each time the refresh cycle counter intcnt finishes counting a refresh cycle period. In other words, the surplus-number-of-times counter pcnt is incremented by one at the issue of the refresh command, and is decremented by one in the case that the refresh cycle counter intcnt reaches zero. If the refresh cycle counter intcnt is positioned as a low-order side counter, the surplus-number-of-times counter pcnt may be positioned as its high-order side counter. The refresh operation is basically performed using an idle time during which no memory access is requested and therefore, the time in which the refresh operation on all of the memory cells of the SDRAM 2 must be completed is subdivided and managed with the count value of the refresh cycle counter, and the whole time thereof is managed by the higher side surplus-number-of-times counter pcnt. The detail of the operation is to be described later.

On the calibration cycle register CALINT, a calibration cycle is set as a calibration interval. The calibration cycle counter calcnt counts the period of a calibration cycle set on the calibration cycle register CALINT. Specifically, the calibration cycle counter calcnt is incremented by one for each issue of the refresh command, and is cleared into zero in the case that its count value reaches a set value of the calibration cycle register CALINT. The calibration cycle is made longer than the refresh cycle.

The first suppression period register TCALRZ is for specifying a period during which the issue of the calibration command is suppressed after the issue of the refresh command. The first suppression period counter rzcnt counts a period set on the first suppression period register TCALRZ. Specifically, in the case that the refresh command is issued, a value set on the first suppression period register TCALRZ is loaded, and the decrement operation is started by the clock. In the case that the count value reaches zero, the counting operation is stopped.

The second suppression period register TCALZR is for specifying a period during which the issue of the refresh command is suppressed after the issue of the calibration command. The second suppression period counter zrcnt counts a period set on the second suppression period register TCALZR. Specifically, in the case that the calibration command is issued, a value set on the second suppression period register TCALZR is loaded, and the decrement operation is started by the clock. In the case that the count value reaches zero, the counting operation is stopped.

On the forcible threshold register REFTH, a forcible threshold is set as a second threshold used to judge whether or not to forcibly issue the refresh command by comparison with a count value of the refresh cycle counter intent.

The control logic 36 creates, by an internal operation according to values set on the registers REFINT, REFPMAX and TCALZR, an urgent threshold as a first threshold used to judge whether or not to perform an urgent issue higher in priority than the forcible issue of the refresh command, and sets the threshold on the register REFTH0. Also, as to the issue of the calibration command, the control logic 36 creates, by an internal operation according to values set on the registers CALINT and TCALZR, a calibration threshold used to judge whether or not to urgently issue the calibration command for the count value of the calibration cycle counter calcnt, and sets the threshold on the register CALTH0.

Figure 7:
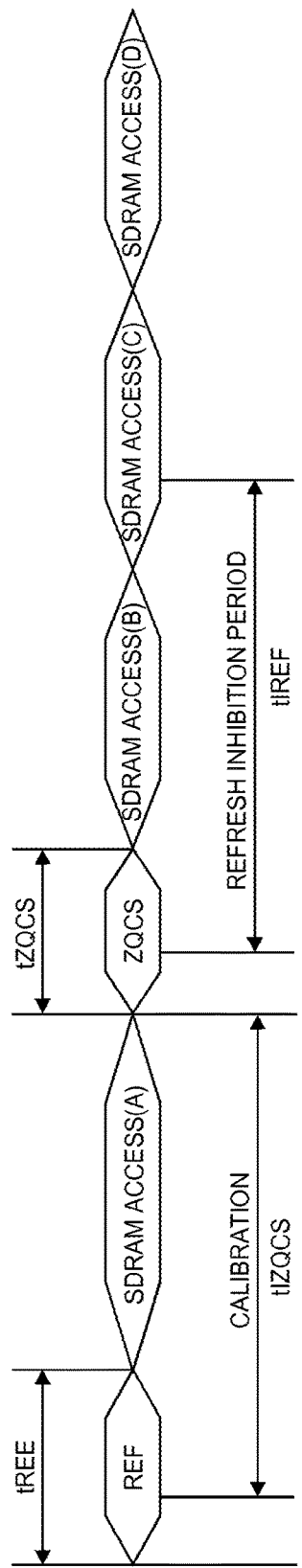
FIG. 7 is a timing chart exemplifying the timing of issue of the refresh command and the calibration command by the SDRAM controller.
Figure 8:
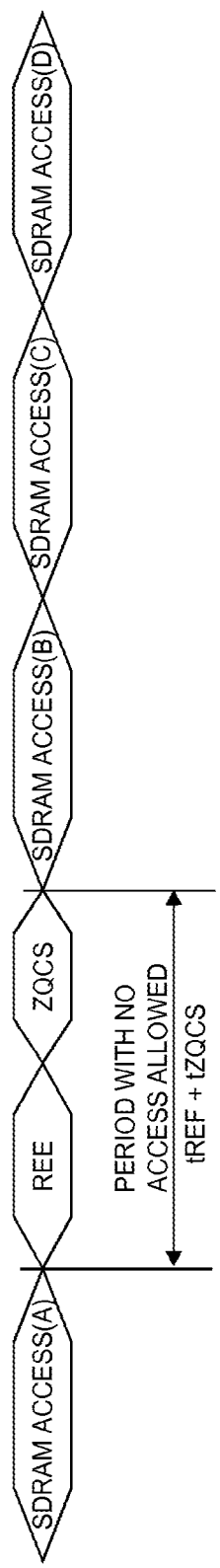
FIG. 8 is a timing chart in a comparative example in the case where no control for the restraint period is performed in contrast with FIG. 7.

FIG. 7 exemplifies the timing of the issue of the refresh command and the calibration command by the SDRAM controller 20. In the case that the refresh command (REF) is issued, then the issue of the calibration command is restrained by the first suppression period counter rzcnt for a first suppression period tIZQCS specified by a value set on the first suppression period register TCALRZ, and a memory access to SDRAM 2 subsequent to the refresh operation is assured. Likewise, in the case that the calibration command (ZQCS) is issued, then the issue of the refresh command is restrained by the second suppression period counter zrcnt for a second suppression period tIREF specified by a value set on the second suppression period register TCALZR, and a memory access to SDRAM 2 subsequent to the calibrating operation is assured. In contrast, in the case where the control for the restraint period is not performed, when the calibration command (ZQCS) is issued subsequently to the refresh command (FRE), it becomes impossible to access to SDRAM for a period of the refresh operation period tREF plus the calibrating operation period tZQCS as exemplified by FIG. 8.

<<Auto Refresh Control Flow>>

Figure 9:
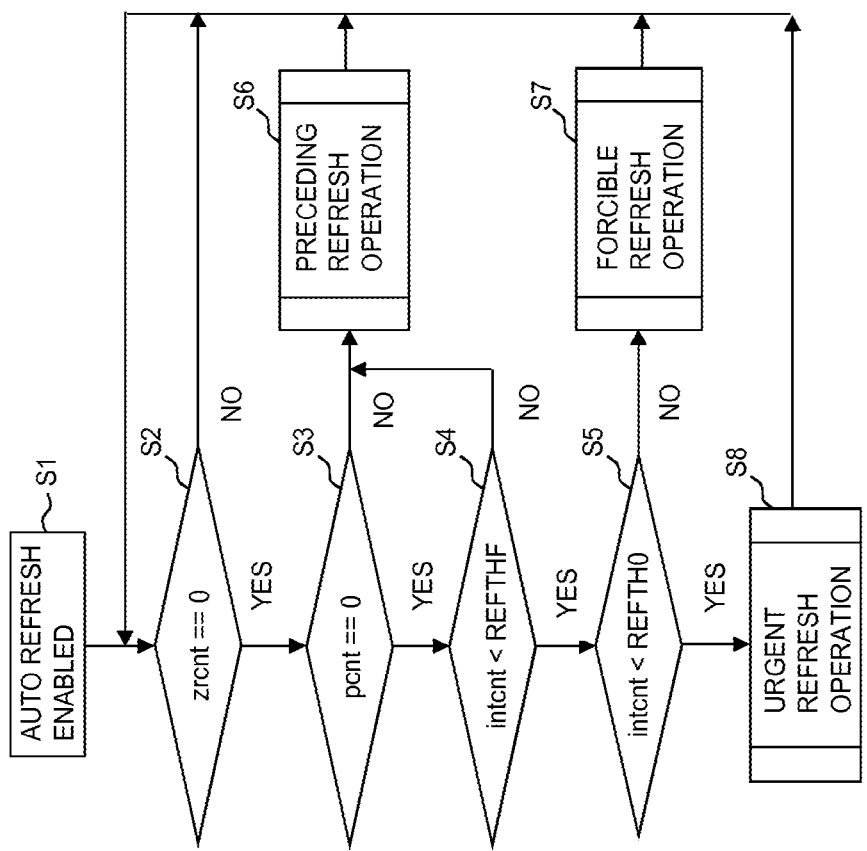
FIG. 9 is a general control flow chart of auto refresh in which a refresh command is used.

FIG. 9 exemplifies a control flow of auto refresh in which the refresh command is used. In the case that an auto refresh operation mode is selected with auto refresh enabled (S1) falls in the inhibition period tIREF of FIG. 7 as long as the value of the second suppression period counter zrcnt does not become zero, and therefore the SDRAM controller waits for the elapse of the period (S2). After the inhibition period tIREF has elapsed, it is judged whether or not the surplus-number-of-times counter pcnt is zero (S3); if not, the SDRAM controller goes to the preceding refresh operation S6. Also, in the case where the surplus-number-of-times counter pcnt is zero, there is a substantial margin as long as the value of the refresh cycle counter intcnt is not smaller than the value of the forcible threshold of the forcible threshold register REFTH, and therefore the SDRAM controller likewise goes to the preceding refresh operation S6 (S4). In the case where the value of the refresh cycle counter intcnt is smaller than the forcible threshold of the forcible threshold register REFTH(S4), it is further judged whether or not the value of the refresh cycle counter intcnt is smaller than the urgent threshold of the urgent threshold register REFTH0. If not, there is a margin, and therefore the SDRAM controller goes to the forcible refresh operation S7, otherwise it goes to the urgent refresh operation S8 because of no margin.

Figure 10:
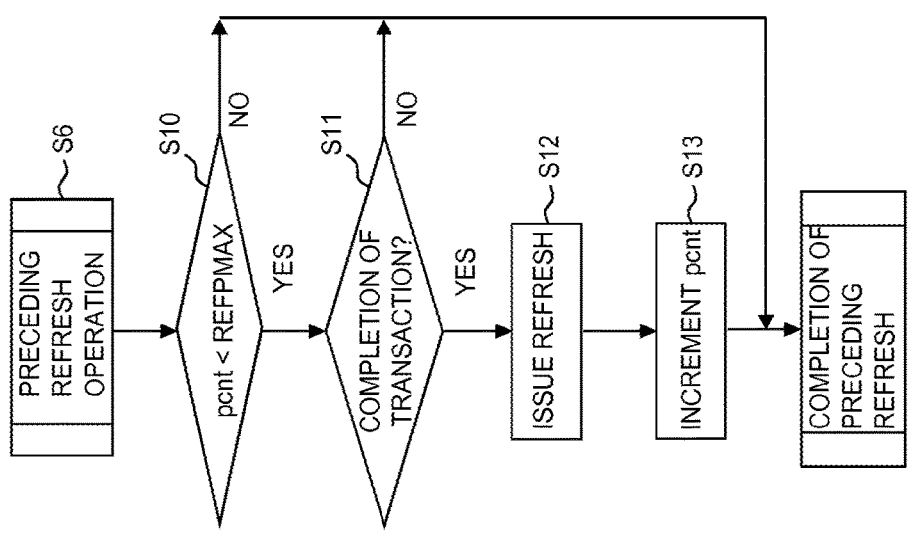
FIG. 10 is a control flow chart of a preceding refresh operation.

FIG. 10 exemplifies a control flow of the preceding refresh operation. In the preceding refresh operation, first it is judged whether or not the value of the surplus-number-of-times counter pcnt is smaller than the value of the maximum-surplus-number-of-times register REFPMAX (S10). If value of the surplus-number-of-times counter is larger, the process is terminated because the refresh operation is not needed at the present moment. If the value of the surplus-number-of-times counter pcnt is smaller than the value of the maximum-surplus-number-of-times register REFPMAX, it is judged whether SDRAM access in response to an access request according to a request packet from the internal bus 21 has been completed (S11). If not, the process is terminated. If the SDRAM access has not been completed, the refresh command is issued (S12), and subsequently the value of the surplus-number-of-times counter pcnt is incremented by one (S13), and the process is terminated.

Figure 11:
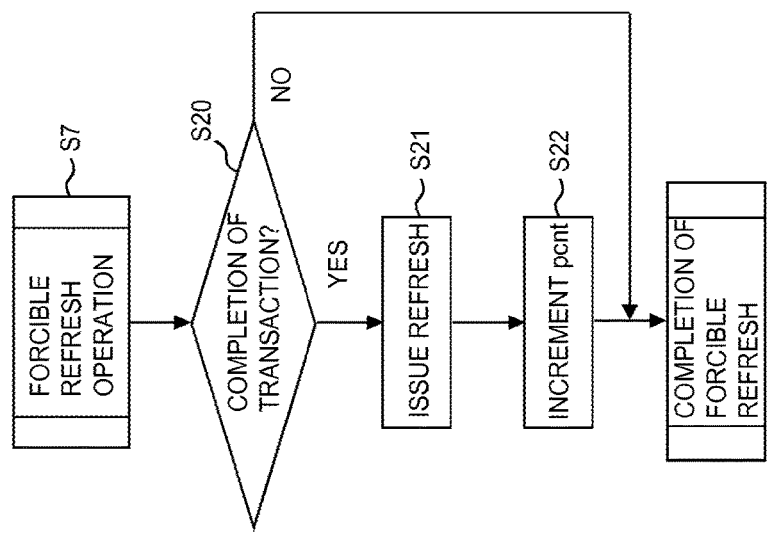
FIG. 11 is a control flow chart of a forcible refresh operation.

FIG. 11 exemplifies a control flow of the forcible refresh operation. In the forcible refresh operation, first it is judged whether the SDRAM access in response to an access request according to a request packet from the internal bus 21 has been completed (S20). If not, the process is terminated, otherwise the refresh command is issued (S21). Subsequently, the value of the surplus-number-of-times counter pcnt is incremented by one (S22), and the process is terminated.

Figure 12:
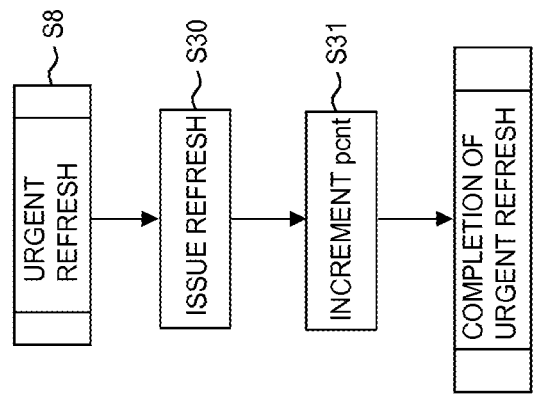
FIG. 12 is a control flow chart of an urgent refresh operation.

FIG. 12 exemplifies a control flow of the urgent refresh operation. In the urgent refresh operation, even if the SDRAM access in response to an access request according to a request packet from the internal bus 21 has not been completed, the refresh command is issued (S30), and subsequently the value of the surplus-number-of-times counter pcnt is incremented by one (S31), and the process is terminated. In the case of interrupting the SDRAM access and forcibly issuing the refresh command in the course of the SDRAM access, the SDRAM controller 20 performs control to resume the interrupted SDRAM access after the completion of refresh as described above.

<<Auto Calibration Control Flow>>

Figure 13:
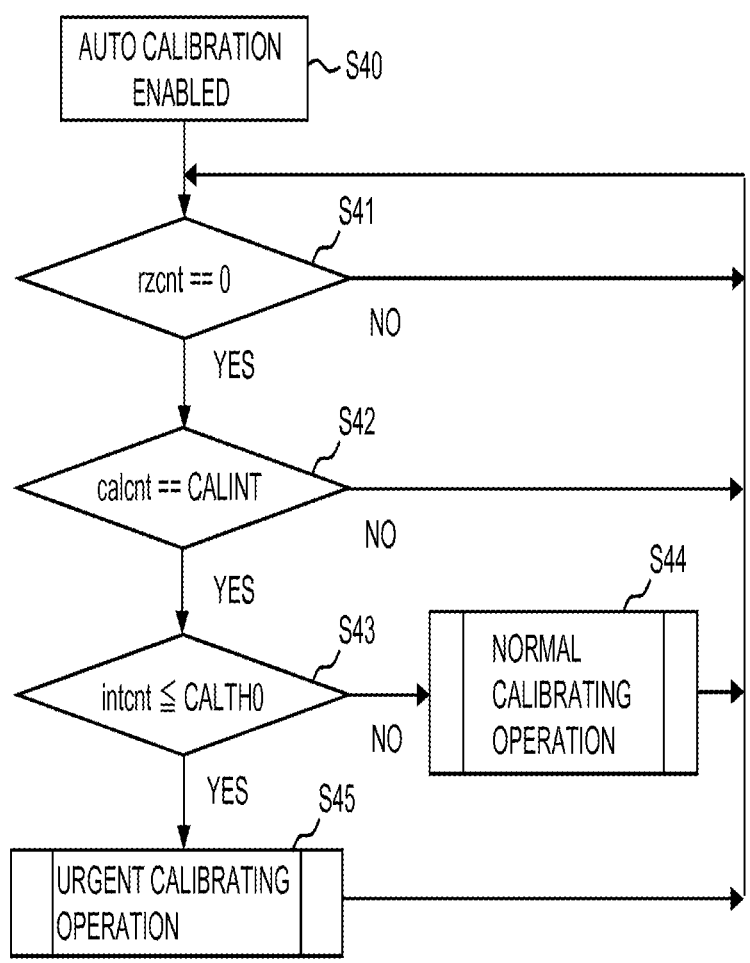
FIG. 13 is a general control flow chart of auto calibration in which a calibration command is used.

FIG. 13 exemplifies a control flow of auto calibration in which the calibration command is used. The time in the case that an auto calibrating operation mode is selected with auto calibration enabled (S40) falls in the inhibition period tIZQCS of FIG. 7 as long as the value of the first suppression period counter rzcnt does not become zero, and therefore the SDRAM controller waits for the elapse of the period (S41). After the inhibition period tIZQCS has elapsed, it is judged whether or not the calibration cycle counter calcnt has reached a value set on the calibration cycle register CALINT (S42); if not, the SDRAM controller waits until it reaches the set value, otherwise it is judged whether or not the value of the refresh cycle counter intcnt is no more than the calibration threshold CALTH0 (S43). There still remains a margin as long as the value of the refresh cycle counter intcnt which counts down has reached the calibration threshold CALTH0 or below, and therefore the SDRAM controller goes to the normal calibrating operation (S44). If the value of the refresh cycle counter intcnt has become the calibration threshold CALTH0 or below at the judgment of S43, the SDRAM controller goes to the urgent calibrating operation S45 because there is no margin.

Figure 14:
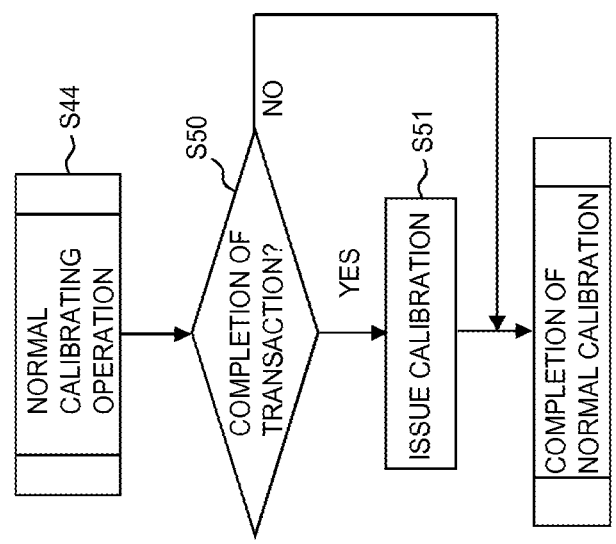
FIG. 14 is a control flow chart of a normal calibrating operation.

FIG. 14 exemplifies a control flow of the normal calibrating operation. In the normal calibrating operation, first it is judged whether an SDRAM access in response to an access request according to a request packet from the internal bus 21 has been completed (S50). If not, the process is terminated, otherwise the calibration command is issued and (S51), and the process is terminated.

Figure 15:
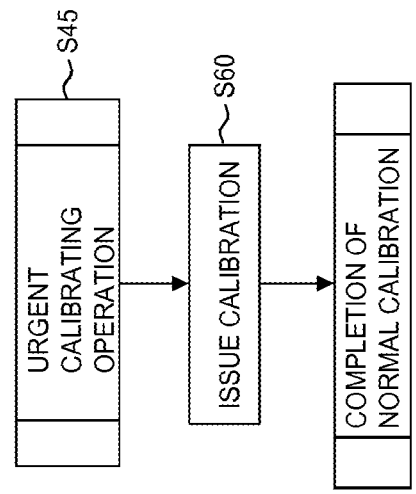
FIG. 15 is a control flow chart of an urgent calibrating operation.

FIG. 15 exemplifies a control flow of the urgent calibrating operation. In the urgent refresh operation, even if an SDRAM access in response to an access request according to a request packet from the internal bus 21 has not been completed, the calibration command is issued (S60), and the process is terminated. In the case of interrupting the SDRAM access and forcibly issuing the calibration command in the course of the SDRAM access, the SDRAM controller 20 performs control to resume the interrupted SDRAM access after the completion of the calibrating operation, as described above.

<<Operation Timing>>

FIG. 16 exemplifies the timing of operation in the case of performing a normal calibration. If the refresh command REF is issued with the refresh cycle counter intcnt having a value of N at Time t1, the value of the surplus-number-of-times counter pcnt is incremented from M to M+1 in synchronization therewith, and the value of the calibration cycle counter calcnt is initialized into zero. In addition, the value of the first suppression period register TCALRZ is loaded to the first suppression period counter rzcnt, and the counter starts to count clocks. The period from Time t1 (after the issue of the refresh command) to t2 until the value of the first suppression period counter rzcnt turns to zero from its initial value makes an issue suppression period tIZQCS of a new calibration command. During this period, e.g. a low address-related active command ACT and a read command READ are issued. After Time t2, the issue of the calibration command is enabled. For instance, the calibration command ZQCS is issued at Time t3. In the case that the calibration command ZQCS is issued, the value of the second suppression period register TCALZR is loaded to the second suppression period counter zrcnt, and the counter starts to count clocks. The period from Time t3 (after the issue of the calibration command) to t4 until the value of the second suppression period counter zrcnt turns to zero from its initial value makes a suppression period tIREF of issue of a new refresh command REF. During this period, e.g. the low address-related active command ACT and the read command READ are issued.

FIG. 17 exemplifies the timing of operation in the case of performing an urgent calibration. If the refresh command REF is issued with the refresh cycle counter intent having a value of one at Time t1, the value of the surplus-number-of-times counter pent is incremented from zero to one, and the value of the calibration cycle counter calcnt is initialized into zero in synchronization with this. In addition, the value of the first suppression period register TCALRZ is loaded to the first suppression period counter rzcnt, and the counter starts to count clocks. The period from Time t1 to t2 until the value of the first suppression period counter rzcnt turns to zero from its initial value makes an issue suppression period tIZQCS of a new calibration command. During this period, e.g. the low address-related active command ACT and the read command READ are issued. In this case the value of the calibration cycle counter calcnt is incremented to the initial value of the register CALINT, and the value of the refresh cycle counter intent is smaller than the threshold CALTH0 at Time t2, and therefore the urgent calibrating operation is selected. Thus, after going through the issue of a precharge-all command (i.e. a command to order a precharge operation which is targeted at all of the banks) PREA, the calibration command ZQCS is issued at Time t4. In the case that the calibration command ZQCS is issued, the value of the second suppression period register TCALZR is loaded to the second suppression period counter zrcnt, and the counter starts to count clocks. The period from Time t3 to t4 until the value of the second suppression period counter zrcnt turns to zero from its initial value makes an issue suppression period tIREF of a new refresh command REF. During this period, e.g. the low address-related active command ACT and the read command READ are issued. In this case the value of the surplus-number-of-times counter pcnt is decremented to zero, and in addition the value of the refresh cycle counter intcnt is smaller than the threshold REFTH0 at Time t4, and therefore the urgent refresh operation is selected. Thus, after going through the issue of a precharge-all command (i.e. a command to order the precharge operation which is targeted at all of the banks) PREA, the refresh command REF is issued at Time t5.

In the case of FIG. 17, even if a bus access is requested of the SDRAM controller 20 with the timing of Times t3 and t5, the SDRAM controller 20 forcibly issues the calibration command ZQCS or the refresh command REF as shown in the drawing. In contrast, in the case of FIG. 16, the timing is different from that shown in the drawing, and the SDRAM controller 20 issues neither the calibration command ZQCS nor the refresh command REF, and waits for the SDRAM access in response to the bus access to be terminated as long as a bus access is required of the SDRAM controller 20 with the timing of Times t3 and t5.

FIGS. 18 to 20 exemplify execution forms of the calibrating operation in the case of controlling a plurality of SDRAMs on which the SDRAM controller 20 selectively performs chip selection. FIG. 18 shows the timing of operation in the case of performing the calibrating operation on the plurality of SDRAMs in parallel, FIG. 19 shows that in the case of sequential and successive executions, and FIG. 20 shows successive data according to the round-robin algorithm.

In the case of parallel execution of FIG. 18, the total execution time becomes shorter, however the maximum power consumption can be increased excessively. In the case of FIG. 19, the maximum power consumption is small, however the total execution time becomes longer. As in the case of FIG. 19, it is resolved in the case of FIG. 20 that a series of the successive calibrating operations causes excessively longer successive memory accesses.

The effect and advantages below can be obtained by the above embodiments.

[1] It becomes possible to avoid that the issue of the refresh command and the issue of the calibration command are arranged in succession, whereby the reduction in access speed owing to the succession of the commands can be prevented.

[2] The period during which the issue of the calibration command is suppressed after the issue of the refresh command, and the period in which the issue of the refresh command is suppressed after the issue of the calibration command can be programmably set on the resisters respectively.

[3] The adoption of the urgent refresh operation makes possible to institute a measure at the time of urgency with a refresh halt period elongated.

[4] Because of the adoption of the forcible refresh operation, the reduction in access performance can be avoided by ensuring the successiveness of the SDRAM access in response to an access request from an access-requesting circuit in the case of the refresh operation with a lower urgency.

[5] Conducting the refresh operation any time with no access to the SDRAM not only causes a waste in the operation, but also ends up reducing the occasion of an access-requesting circuit to access the SDRAM. Considering a count value of the surplus number of times, the actualization of such disadvantage can be avoided. In short, in the case of a refresh operation with a lower urgency, an access to the SDRAM from the access-requesting circuit can be given top priority rather than the refresh operation.

[6] The adoption of the urgent calibrating operation makes possible to institute a measure at the time of urgency with a calibration halt period elongated.

[7] Because of the adoption of the normal calibrating operation, the reduction in access performance can be avoided by ensuring the successiveness of the SDRAM access in response to an access request from the access-requesting circuit in the case of the calibrating operation with a lower urgency.

[8] Since control such that the calibration cycle counter performs a counting operation for each issue of the refresh command, and the count value is returned to its initial value in the case of reaching a value set on the calibration cycle register is adopted, the control of the counting operation of the calibration cycle counter is facilitated on condition that the intervals to perform the calibrating operation at are longer than those to perform the refresh operation at. Particularly, the control like that is excellent in the harmonization with the operation of judging whether to issue the calibration command urgently based on whether or not the value of the refresh cycle counter has reached the calibration threshold (CALTH0).

While the invention made by the inventor has been specifically described above based on the embodiments thereof, the invention is not so limited. It is obvious that various changes may be made without departing from the subject matter thereof.

For instance, the SDRAM is not limited to DDR3. The number of SDRAMs connected with the SDRAM controller is not limited. The setting of the registers is not limited to the setting by CPU. In addition, another circuit may be used instead of the register. An on-chip circuit module of a microcomputer is not limited to the above description. The internal bus is not limited to the above, and it may be composed of hierarchically organized buses, and is not limited to the split transaction bus. Also, the access commands to the SDRAM are not limited to the active command ACT, the read command READ, the write command, etc. and they may include another command, or may be other commands.

INDUSTRIAL APPLICABILITY

The present invention can be applied to a memory control technique for controlling DDR-SDRAM, and particularly to a technique for controlling the issue of a refresh command and a calibration command widely.

What is claimed is:
1. A semiconductor device comprising:
a memory control circuit which controls a DDR type SDRAM; and
an access-requesting circuit operable to make a request for an access to the SDRAM to the memory control circuit;
wherein the memory control circuit issues an access command to respond to an access request from the access-requesting circuit, a refresh command to make a request for a refresh operation for reproducing stored information of the SDRAM based on a set refresh cycle, and a calibration command to make a request for a calibrating operation for correcting a termination resistance of the SDRAM based on a set calibration cycle,
wherein the memory control circuit includes:
a first register which specifies a period during which the issue of the calibration command to a portion of the SDRAM is restricted after the issue of the refresh command to said portion of the SDRAM;
a refresh cycle register that specifies the set refresh cycle; and
a calibration cycle register that specifies the set calibration cycle.

2. The semiconductor device according to claim 1, wherein the memory control circuit includes a counter which counts a period set on the first register, and restricts the issue of the calibration command until a count value of the counter exceeds the period set on the first register after the issue of the refresh command.

3. The semiconductor device according to claim 1, wherein the memory control circuit comprises a refresh cycle counter configured to count a period of the refresh cycle, and
wherein the memory control circuit is configured to:
determine if the access request has been completed;
if the access request has not been completed and a value of the refresh cycle counter is equal to or greater than a first threshold, interrupt the access request and issue the refresh command; and
if the access request has not been completed and a value of the refresh cycle counter is less than the first threshold but greater than a second threshold, delay issue of the refresh command until after the access request is completed.

4. The semiconductor device according to claim 3, wherein the memory control circuit comprises:
an urgent threshold register that specifies the first threshold; and
a forcible threshold register that specifies the second threshold.

5. A semiconductor device comprising:
a memory control circuit which controls a DDR type SDRAM; and
an access-requesting circuit operable to make a request for an access to the SDRAM to the memory control circuit;
wherein the memory control circuit issues an access command to respond to an access request from the access-requesting circuit, a refresh command to make a request for a refresh operation for reproducing stored information of the SDRAM based on a set refresh cycle, and a calibration command to make a request for a calibrating operation for correcting a termination resistance of the SDRAM based on a set calibration cycle,
wherein the memory control circuit includes:
a first register which specifies a period during which the issue of the refresh command to a portion of the SDRAM is restricted after the issue of the calibration command to said portion of the SDRAM;
a refresh cycle register that specifies the set refresh cycle; and
a calibration cycle register that specifies the set calibration cycle.

6. The semiconductor device according to claim 5, wherein the memory control circuit includes a counter which counts a period set on the first register, and restricts the issue of the refresh command until a count value of the counter exceeds the period set on the first register after the issue of the calibration command.

7. The semiconductor device according to claim 5, wherein the memory control circuit comprises:
   a calibration cycle counter configured to count a period of the calibration cycle; and
   a refresh cycle counter configured to count a period of the refresh cycle.

8. The semiconductor device according to claim 7, wherein the memory control circuit is configured to:
   determine if the access request has been completed;
   if the access request has not been completed, a value of the calibration cycle counter is equal to a value specified by the calibration cycle register, and a value of the refresh cycle counter is equal to or less than a calibration threshold, interrupt the access request and issue the calibration command; and
   if the access request has not been completed, a value of the calibration cycle counter is equal to the value specified by the calibration cycle register, and the value of the refresh cycle counter is greater than the calibration threshold, delay issue of the calibration command until after the access request is completed.

9. A microcomputer comprising:
   a CPU;
   a bus which is coupled to the CPU; and
   a memory control circuit which is coupled to the bus, and which controls a DDR type SDRAM,
   wherein the memory control circuit issues an access command to respond to an access request from the CPU, a refresh command to make a request for a refresh operation for reproducing stored information of the SDRAM based on a set refresh cycle, and a calibration command to make a request for a calibrating operation for correcting a termination resistance of the SDRAM based on a set calibration cycle,
   wherein the memory control circuit includes:
      a first register which specifies a period during which the issue of the calibration command to a portion of the SDRAM is restricted after the issue of the refresh command to said portion of the SDRAM;
      a refresh cycle register that specifies the set refresh cycle; and
      a calibration cycle register that specifies the set calibration cycle.

10. The microcomputer according to claim 9, wherein the memory control circuit includes a counter which counts a period set on the first register, and restricts the issue of the calibration command until a count value of the counter exceeds the period set on the first register after the issue of the refresh command.

11. The microcomputer according to claim 9,
   wherein the memory control circuit comprises a refresh cycle counter configured to count a period of the refresh cycle, and
   wherein the memory control circuit is configured to:
      determine if the access request has been completed;
      if the access request has not been completed and a value of the refresh cycle counter is equal to or greater than a first threshold, interrupt the access request and issue the refresh command; and
      if the access request has not been completed and a value of the refresh cycle counter is less than the first threshold but greater than a second threshold, delay issue of the refresh command until after the access request is completed.

12. The microcomputer according to claim 11, wherein the memory control circuit comprises:
   an urgent threshold register that specifies the first threshold; and
   a forcible threshold register that specifies the second threshold.

13. A microcomputer comprising:
   a CPU;
   a bus which is coupled to the CPU; and
   a memory control circuit which is coupled to the bus, and which controls a DDR type SDRAM,
   wherein the memory control circuit issues an access command to respond to an access request from the CPU, a refresh command to make a request for a refresh operation for reproducing stored information of the SDRAM based on a set refresh cycle, and a calibration command to make a request for a calibrating operation for correcting a termination resistance of the SDRAM based on a set calibration cycle,
   wherein the memory control circuit includes:
      a first register which specifies a period during which the issue of the refresh command to a portion of the SDRAM is restricted after the issue of the calibration command to said portion of the SDRAM;
      a refresh cycle register that specifies the set refresh cycle; and
      a calibration cycle register that specifies the set calibration cycle.

14. The microcomputer according to claim 13, wherein the memory control circuit includes a counter which counts a period set on the first register, and restricts the issue of the refresh command until a count value of the counter exceeds the period set on the first register after the issue of the calibration command.

15. The microcomputer according to claim 13, wherein the memory control circuit comprises:
   a calibration cycle counter configured to count a period of the calibration cycle; and
   a refresh cycle counter configured to count a period of the refresh cycle.

16. The microcomputer according to claim 15, wherein the memory control circuit is configured to:
   determine if the access request has been completed;
   if the access request has not been completed, a value of the calibration cycle counter is equal to a value specified by the calibration cycle register, and a value of the refresh cycle counter is equal to or less than a calibration threshold, interrupt the access request and issue the calibration command; and
   if the access request has not been completed, a value of the calibration cycle counter is equal to the value specified by the calibration cycle register, and the value of the refresh cycle counter is greater than the calibration threshold, delay issue of the calibration command until after the access request is completed.

\* \* \* \* \*